(12) United States Patent
Cho et al.

(10) Patent No.: US 8,198,191 B2
(45) Date of Patent: Jun. 12, 2012

(54) METHOD OF PREPARING LOW RESISTANCE METAL LINE, PATTERNED METAL LINE STRUCTURE, AND DISPLAY DEVICE USING THE SAME

(75) Inventors: Sung Hen Cho, Seoul (KR); Ki Yong Song, Seoul (KR); Sang Eun Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/843,422

(22) Filed: Jul. 26, 2010

(65) Prior Publication Data

US 2011/0168669 A1    Jul. 14, 2011

Related U.S. Application Data

(62) Division of application No. 12/018,650, filed on Jan. 23, 2008, now abandoned.

(30) Foreign Application Priority Data

Apr. 26, 2007  (KR) .................. 10-2007-0040887

(51) Int. Cl.
*H01L 21/4763* (2006.01)
(52) U.S. Cl. ............................................. 438/622; 23/1
(58) Field of Classification Search ................ 438/622; 257/E23.001, E23.145, E23.168
See application file for complete search history.

(56) References Cited

U.S. PATENT DOCUMENTS

| | | | | |
|---|---|---|---|---|
| 5,614,728 | A * | 3/1997 | Akiyama | 257/57 |
| 5,696,207 | A * | 12/1997 | Vargo et al. | 525/326.2 |
| 5,945,486 | A | 8/1999 | Vargo et al. | |
| 7,259,095 | B2 * | 8/2007 | Ueno | 438/686 |
| 7,309,658 | B2 * | 12/2007 | Lazovsky et al. | 438/754 |
| 7,695,981 | B2 * | 4/2010 | Dai et al. | 438/1 |
| 2007/0153488 | A1 | 7/2007 | Yang et al. | |
| 2009/0239331 | A1 * | 9/2009 | Xu et al. | 438/98 |
| 2009/0304914 | A1 | 12/2009 | Nalla et al. | |

FOREIGN PATENT DOCUMENTS

| | | |
|---|---|---|
| KR | 1020040063367 | 7/2004 |
| KR | 1020050028646 | 3/2005 |
| KR | 1020050061285 | 6/2005 |
| KR | 1020060026201 | 3/2006 |

* cited by examiner

*Primary Examiner* — Thao P. Le
(74) *Attorney, Agent, or Firm* — Cantor Colburn LLP

(57) ABSTRACT

Disclosed herein is a method of preparing a low resistance metal line, in which a wet plating technique is used instead of a vacuum film forming process in order to simplify the process and decrease the manufacturing cost. In addition, a self-assembled monolayer is formed that facilitates the increased adsorption density and strength of the metal catalyst resulting in the formation of a high-density metal catalyst layer, thereby obtaining a high-quality metal line. Also disclosed herein, are a patterned metal line structure, and a display device using the same.

14 Claims, 6 Drawing Sheets

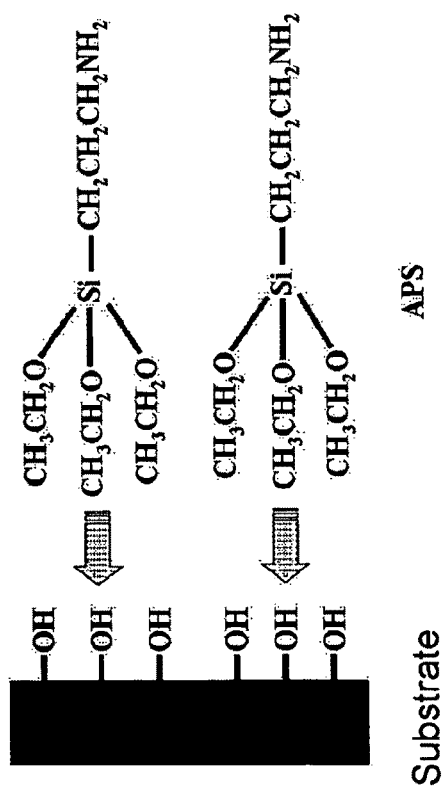
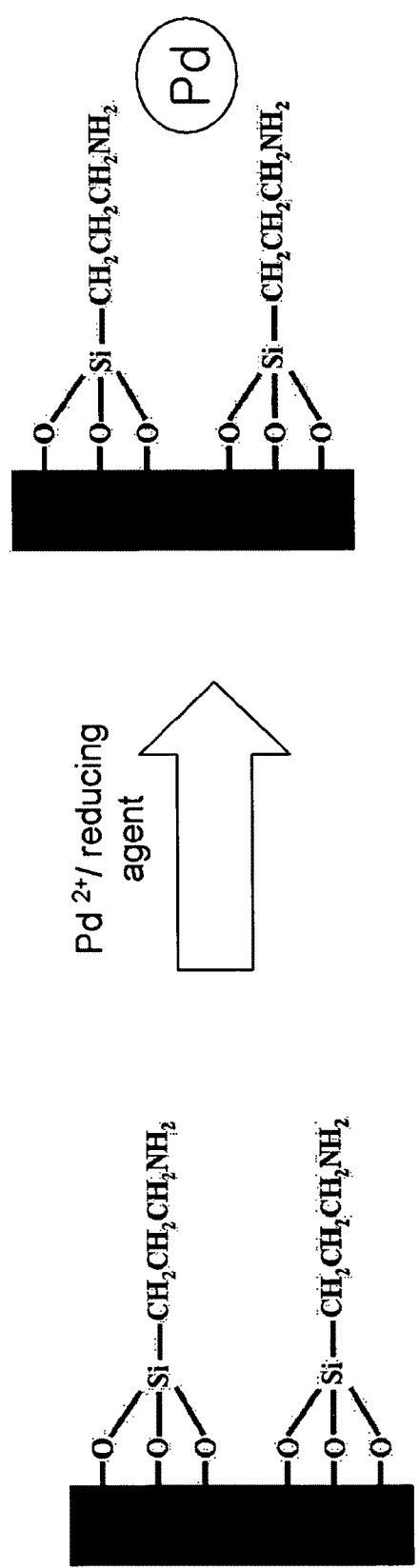
FIG. 3

METHOD OF PREPARING LOW RESISTANCE METAL LINE, PATTERNED METAL LINE STRUCTURE, AND DISPLAY DEVICE USING THE SAME

CROSS-REFERENCE TO RELATED APPLICATIONS

This application is a divisional of U.S. patent application Ser. No. 12/018,650, filed on Jan. 23, 2008, which claims priority to Korean Patent Application No. 2007-40887, filed on Apr. 26, 2007, and all the benefits accruing therefrom under 35 U.S.C. §119, the entire contents of which are herein incorporated by reference.

BACKGROUND

1. Field of the Invention

This disclosure is directed to a method of preparing a low resistance metal line, a patterned metal line structure, and a display device using the same. More specifically, the method is directed to the preparation of a low resistance metal line, in which a wet plating process is used instead of a vacuum film forming process, thereby simplifying the process and decreasing the cost. In addition, the method is also directed to the formation of a self-assembled monolayer (SAM) in which the adsorption density, and the strength of the metal catalyst are increased, resulting in the formation of a high-density metal catalyst layer, and thereby obtaining a high-quality metal line.

2. Description of the Related Art

As electronic apparatuses become miniaturized and more highly integrated, the line width subsequently becomes narrow, resulting in an increase in the metal line resistance and the signal delay, undesirably causing problems related to decreased display quality. In particular, these problems impede the development of thin film transistor-liquid crystal displays (TFT-LCDs) that simultaneously possess high image quality and a large surface area.

Typically, liquid crystal displays (LCDs), for example, a flat panel display device, adopt a driving method for applying voltage to a display material, using for example, liquid crystals interposed between a pair of substrates. In this example, an electrical line formed of conductive material is arranged on at least one substrate.

For example, an active matrix driving type LCD, comprises a pair of substrates having a display material interposed therebetween. On any one of the active matrix substrates, a gate electrode and a data electrode are disposed in a matrix arrangement, and in the area where the gate electrode and the data electrode intersect, a thin film transistor (TFT) and a pixel electrode are disposed. The gate electrode and the data electrode are primarily formed of a metal, such as, for example, tantalum (Ta), aluminum (Al), or molybdenum (Mo), and are provided in the form of a film produced using a dry film forming process, such as sputtering.

In the case where it is desired to produce a flat panel display device having an increased area with improved resolution, the drive signal delay is regarded as a significant problem. The problems are attributable to the increase in the line resistance and the increase in parasitic capacitance in proportion to the increase in drive frequency.

Therefore, in order to solve the problem of drive signal delay, attempts have been made to use copper (Cu) as the line material in place of conventionally used Al, α-Ta, and Mo, due to the lower electrical resistance and superior charge mobility of Cu. Because Cu is a material having relatively low resistivity and superior electro-migration resistance, significant effort has been undertaken to develop various new techniques that make use of these properties of copper. For example, in the chapter "Low Resistance Copper Address Line For TFT-LCD" (*Japan Display* 1989, p. 498-501), the use of Cu as a material for a gate electrode in a TFT-LCD are disclosed.

Further, the above reference discloses the need for the improvement of adhesion so that a metal film, such as Ta, may be utilized as a substrate, because the Cu film, which is formed through sputtering, has poor adhesion to a glass substrate.

In the case where both the Cu film for decreasing the resistance and the substrate-metal Ta film for improving the adhesion of the Cu film are formed using a vacuum film forming technique, such as sputtering, separate film forming processes for the Cu film and the substrate-metal Ta film are utilized. Furthermore, there are also separate etching processes for the Cu film and the substrate-metal Ta film. Consequently, the number of processes is increased, thereby undesirably increasing the cost of preparation. In addition, as the area of the display is increased, that is, as the film forming area is enlarged, large-scale vacuum film forming and etching devices are needed, resulting in a further increase in production costs.

Accordingly, the establishment of a wet plating technique for the preparation of a Cu line that can be used to form a film at a low cost, and without the use of the vacuum film forming device, is desired.

Electroless plating is among the methods used for the formation of a copper line. Electroless plating is a method that takes advantage of the difference in ionization tendency between a reducing agent and an oxidizing agent present in a plating solution. The method comprises activating the surface of a substrate and then plating a desired film on the substrate. Because the electroless plating method is applied uniformly over the entire surface of the substrate, without the use of an external power source, it effectively realizes a low production cost and a simple process, resulting in outstanding productivity.

In the electroless plating method, a metal film is directly plated on a diffusion barrier using an electrochemical process. Consequently, the fine interfacial structure between the diffusion barrier and the metal film, and the interfacial reaction, considerably affect the properties of the metal line, including the electrical properties and thermal stability. Further, in the electroless plating method, a metal catalyst nucleus is formed through activation prior to the formation of the metal plating layer. The metal catalyst nucleus functions as a catalyst upon plating, thereby facilitating the plating process.

However, the electroless plating method is unsuitable for practical applications because the plated film, obtained through activation using tin and palladium, has poor adhesion.

SUMMARY

Disclosed herein is a method of preparing a low resistance metal line, which comprises: forming a mask pattern for a metal line on a substrate; applying a self-assembled monolayer (SAM) on the substrate; forming a seed layer on the substrate by immersing the substrate comprising the SAM in an activating solution comprising a metal for activation; plating an assistant metal film on the seed layer; removing the mask pattern and the layers thereon by means of lift-off; and plating a metal layer on the patterned assistant metal film.

Disclosed herein too is a low resistance metal structure prepared using the above method.

Disclosed herein too is a display device comprising the metal line structure.

In one embodiment, a patterned metal line structure is formed on a substrate that comprises: a SAM, a seed layer having a metal catalyst, and an assistant metal film, disposed between a lower substrate and an upper metal layer.

In another embodiment, the metal line structure comprises: the SAM applied on the substrate; the seed layer comprising the metal catalyst formed on the SAM; the assistant metal film layer formed on the seed layer; and the metal layer formed on the assistant metal film layer.

In yet another embodiment, a display device is provided comprising the disclosed patterned metal line structure. Specifically, the metal line structure of the invention may be used in LCDs.

BRIEF DESCRIPTION OF THE DRAWINGS

Example embodiments will be more clearly understood from the following detailed description taken in conjunction with the accompanying drawings, in which:

FIG. 3 is a schematic diagram illustrating the mechanism for attaching a SAM to a substrate and to a metal catalyst in the low resistance metal line structure;

DESCRIPTION OF THE PREFERRED EMBODIMENTS

Hereinafter, a detailed description will be given of example embodiments with reference to the accompanying drawings.

It will be understood that when an element or layer is referred to as being "on," "interposed," "disposed," or "between" another element or layer, it can be directly on, interposed, disposed, or between the other element or layer or intervening elements or layers may be present.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, first element, component, region, layer or section discussed below could be termed second element, component, region, layer or section without departing from the teachings of the present invention.

As used herein, the singular forms "a," "an" and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to one embodiment, a method of preparing a low resistance metal line is provided wherein the method comprises: forming a mask pattern for a metal line on a substrate; applying a SAM on the substrate; forming a seed layer on the substrate through activation; plating an assistant metal film on the seed layer; removing the mask pattern and the portions thereon by means of lift-off; and plating a metal layer on the patterned assistant metal film.

Figure 1:
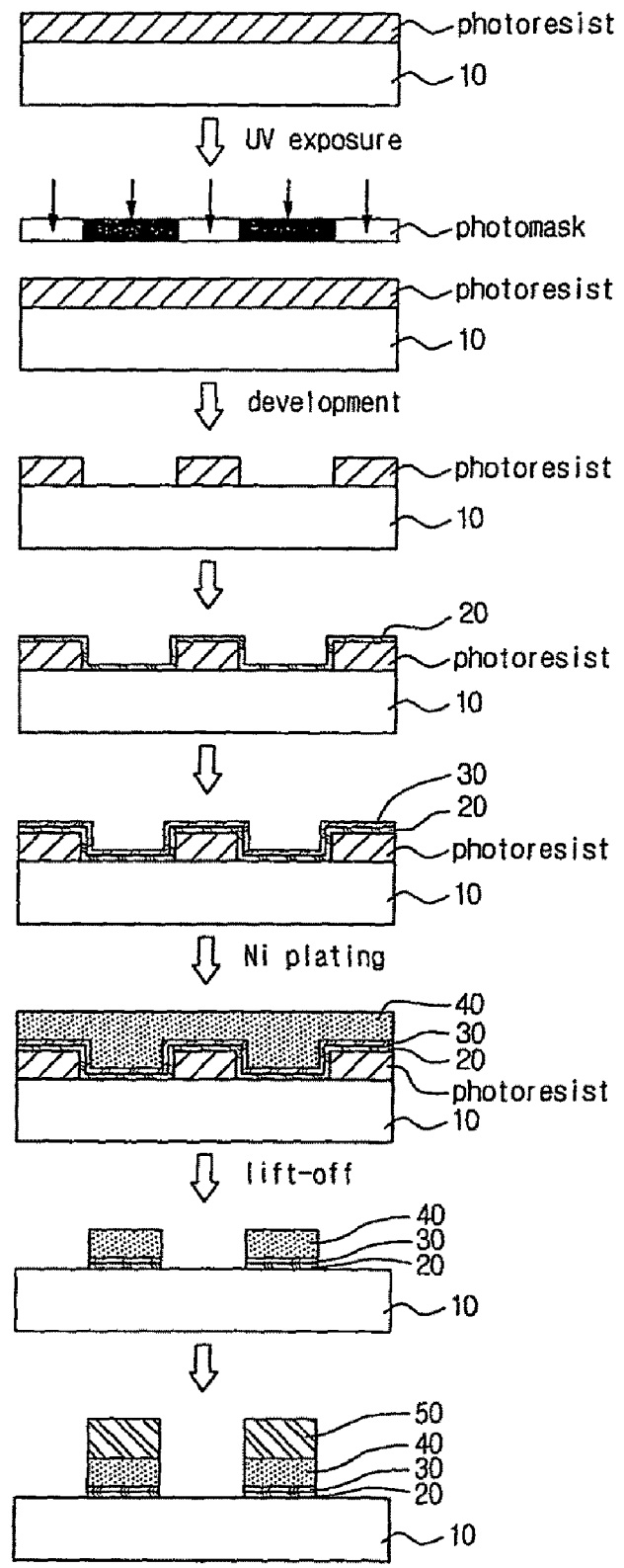
FIG. 1 provides a series of cross-sectional views sequentially illustrating an exemplary process of preparing a low resistance metal line.
Figure 2:
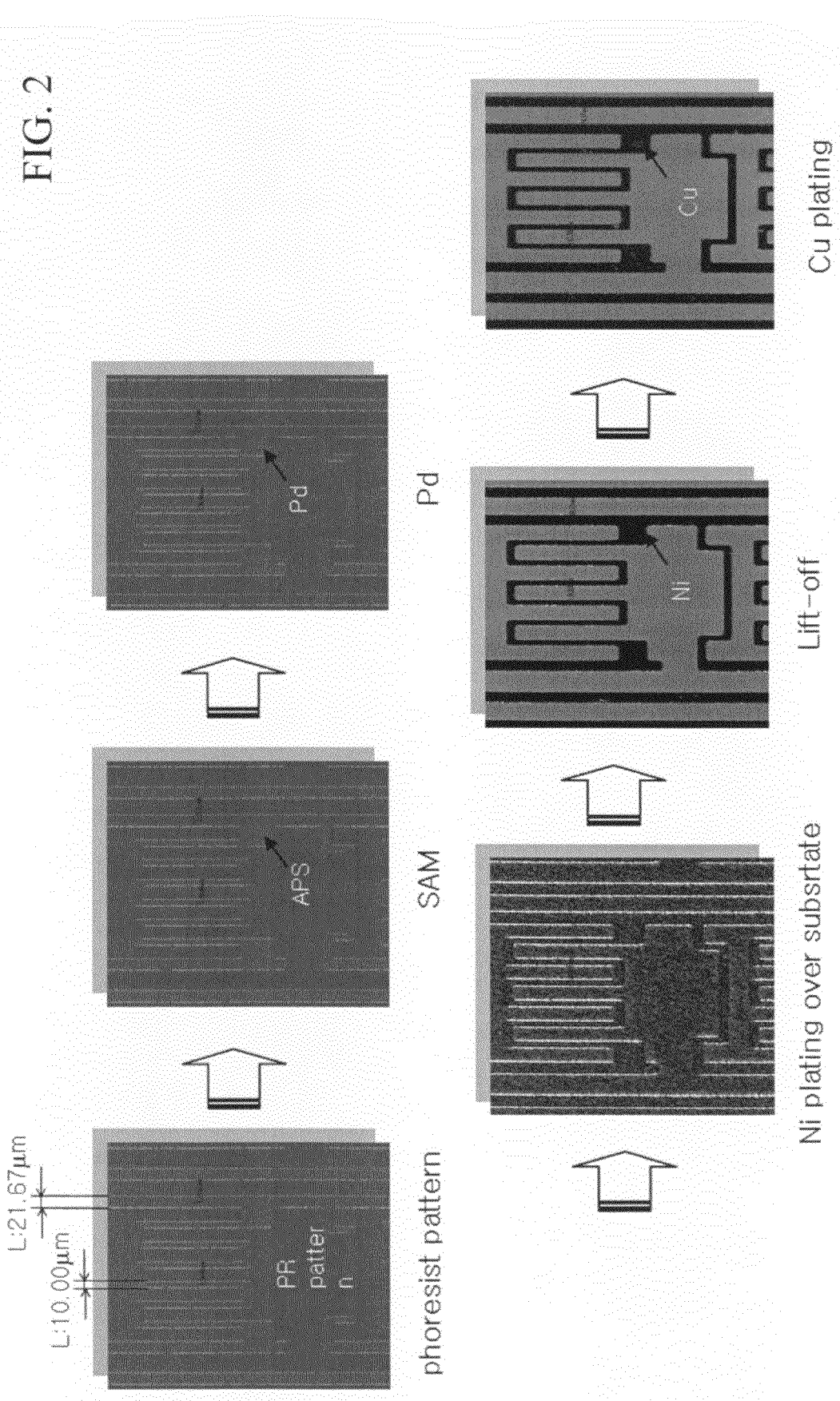
FIG. 2 provides a series of sequential views of the upper surface of the substrate for an LCD, illustrating the individual steps for the process of preparing a low resistance metal line.

FIG. 1 provides a series of cross-sectional views sequentially illustrating an exemplary process for preparing a low resistance metal line. FIG. 2 provides a series of sequential views of the upper surface of a substrate, illustrating the individual steps for the exemplary process of preparing the low resistance metal line. With reference to FIGS. 1 and 2, when the low resistance metal line is formed using the method disclosed herein, a mask pattern for a metal line is formed on a substrate 10. Subsequently, a SAM 20 is applied on the entire upper surface of the substrate comprising the mask pattern. Thereafter, the substrate comprising the SAM 20 is activated using a metal catalyst, such as, for example, palladium, to thus form a seed layer 30 thereon, and thereby attaining a metal catalyst nucleus. Subsequently, nickel is plated on the entire upper surface of the seed layer, thus forming an assistant metal film 40. Thereafter, the mask pattern and the portions thereon are removed using a lift-off process, thereby obtaining a pattern for a desired metal line structure. Finally, a metal layer 50 is formed on the patterned assistant metal film 40, thereby completing a low resistance metal line.

Below, individual steps of example embodiments are described in detail with reference to FIGS. 1 and 2.

Formation of a Metal Line Mask Pattern

The type of substrate used is not particularly limited, and a plastic substrate or a glass substrate may be used.

The method used in the formation of a mask pattern is not particularly limited and may be any typical process. For example, the substrate 10 is coated with a photoresist composition and is then subjected to photolithography, including selective exposure to UV light using a photomask, and then to development, thereby forming a predetermined pattern. Although the usable photoresist composition and exposure conditions are not particularly limited, the mask pattern should be complementary to the pattern for the desired metal line structure, which is subsequently formed upon the removal of the mask pattern through the use of a lift-off process.

Formation of a SAM

After the mask pattern is formed on the substrate, a SAM 20 is applied on the entire upper surface of the patterned substrate 10. The SAM is formed by treating the upper surface of the substrate with a SAM forming compound under predetermined conditions. In one embodiment, an example of a SAM forming compound is an organosilane compound, however the type of SAM forming compound is not particularly limited. FIG. 3 is a schematic exemplary illustration of a mechanism for adhering the SAM to the substrate, and to a metal catalyst, in the low resistance metal line structure. As illustrated in FIG. 3, as the organosilane compound is hydrolyzed and condensed, it is covalently bound to the substrate, thereby producing a metal line structure having strong adhesion to the substrate. Further, the substrate coated with the SAM has an increased adsorption density and adsorption strength for the metal catalyst, thus enabling the growth of a more stable metal catalyst layer and metal layer.

The SAM forming compound is not limited to an organosilane compound. In another embodiment, the SAM compound comprises any compound represented by Formula 1 below:

$$Si(OR)_{3-n}(R)_nX \quad \text{[Formula 1]}$$

In Formula 1, R is a $C_{1-12}$ alkyl group, an alkylene group, or a phenyl group; X is AB, in which A is a $C_{1-12}$ alkyl group, an alkylene group, or a phenyl group, and B is an amino group, a cyano group, a mercapto group, a pyridine group, or a diphenylphosphine group; and n is an integer from 0 to 3.

Examples of the SAM forming compound represented by Formula 1, include, but are not limited to, a compound selected from the group represented by Formula 2 below:

[Formula 2]

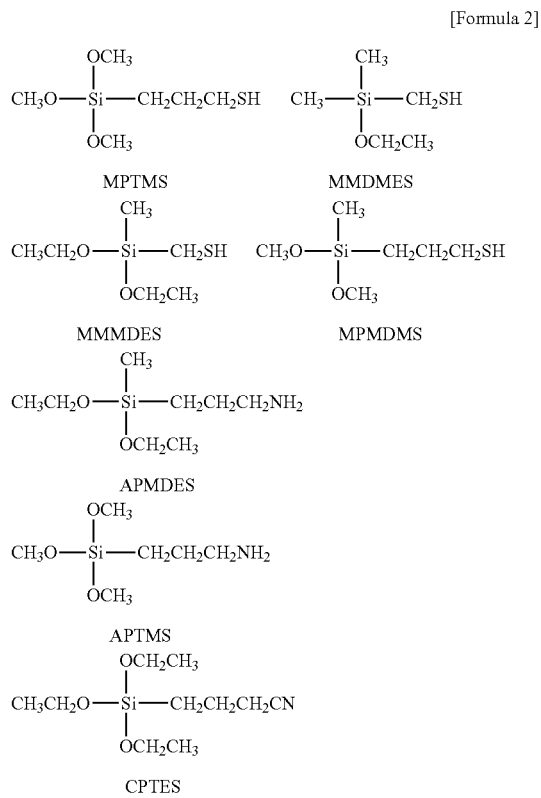

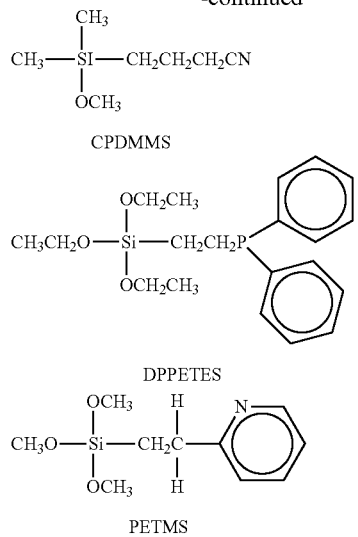

In yet another embodiment, the SAM forming process may be conducted using a solution obtained by dissolving the SAM forming compound in an organic solvent. More specifically, the above process may be performed by immersing the substrate in a SAM forming solution having a predetermined concentration, at a predetermined temperature, for a predetermined amount of time.

Examples of the organic solvent include alcohols, such as, for example, ethanol, ethers, alkanes, chlorinated alkanes, aromatics, glycols, or a combination comprising at least one of the foregoing organic solvents.

The SAM forming compound is contained in the SAM forming solution in a predetermined amount, preferably an amount of about 0.05 to about 1.0 weight percent (wt %).

The treatment of the substrate with the SAM may be performed under general treatment conditions, for example, at about 0 to about 150° C., for a time period ranging from about 10 seconds (sec) to about 30 minutes (min), using dipping, spin coating, or jetting methods.

In this way, the SAM is formed on the substrate comprising the mask pattern using the SAM coating process, thereby providing a means for increasing the adsorption density and strength of the catalyst metal in a subsequent seed layer forming process. Accordingly, following the seed layer forming process, an increase in the density of the metal nucleus makes it possible to improve all of the properties of a metal layer produced using a subsequent electroless plating process, including the electrical conductivity and adhesion properties of the metal layer.

Formation of a Seed Layer

The electroless plating process is conducted through the process of autocatalytic nucleation and growth, and a seed is formed in order to initiate the reaction. Because most metals do not function as a catalyst, the metal nucleus for metal growth is formed through activation prior to the electroless plating process.

Following the SAM treatment, the process of activation is conducted in order to form an active layer on the metal nucleus. The methods used in the formation of a seed layer are not particularly limited and may be any typical processes, e.g. immersing method, spin coating, vapor deposition, Langmuir Blodgett method.

For example, the activation is conducted by immersing the substrate comprising the SAM in an activating solution containing a metal for activation, such as palladium, at about room temperature for a predetermined time. In this way, an activated metal nucleus is produced on the substrate comprising the SAM. The activated metal nucleus functions as a catalyst thereby facilitating the electroless plating process.

Examples of the metal nucleus catalyst include any one selected from the group consisting of gold, silver, copper, nickel, tin, iron, palladium, platinum, and a combination comprising at least one of the foregoing metals. Specifically, an activating solution containing a palladium metal may comprise a palladium compound, for example, palladium, palladium alloy, and palladium chloride. Examples of the solvent that may be used for the activating solution include, sulfuric acid, hydrochloric acid, nitric acid, hydrogen peroxide, or a combination comprising at least one of the foregoing solvents. When the activation is completed, the substrate is washed with water, for example, deionized water, to remove any residual activating solution.

Through such activation, the metal nucleus is produced in the form of a catalyst film. The metal nucleus film functions as a catalyst to promote the growth of metal crystals in a subsequent plating process.

Formation of an Assistant Metal Film

Subsequently, an assistant metal film is plated on the seed layer. The assistant metal film is strongly adhered to the substrate and thereby provides a means to facilitate, or "assist" in, the adhesion of the final metal layer to the substrate. For example, in the case where a copper film layer is formed on the substrate through an electroless plating process, sufficient adhesion of the copper film to the substrate is not guaranteed, and thus the assistant metal film, such as nickel, having good adhesion to the substrate, is formed prior to the formation of the copper film.

Examples of metals that may be used for the assistant metal film include nickel, tin, cobalt, or zinc, or a combination comprising at least one of the foregoing metals.

The process for plating the assistant metal film is conducted according to a typical method. For example, in the case of a nickel film, a nickel-plating solution containing nickel chloride is used. Following the plating process, annealing may be additionally conducted in order to increase the amount of adhesion.

The nickel film is preferably about 5 to about 100 nanometers (nm) thick. In consideration of uniformity and electrical conductivity, an optimal thickness should be determined and set.

Lift-Off

As illustrated in FIGS. 1 and 2, a lift-off process is conducted following the plating of the assistant metal film, and prior to the plating of a final metal layer. Thereby, a desired metal line pattern is formed and the metal layer is selectively plated only on the pattern. Specifically, when the mask pattern is removed using a solution or organic solvent (e.g., acetone) designed to dissolve the mask pattern, the SAM 20, the seed layer 30, and the assistant metal film 40, which are layered on the mask pattern, are removed together. Thus, the mask pattern is removed, leaving behind the desired metal line structure.

Formation of a Metal Layer

A metal layer 50 is selectively plated only on the patterned assistant metal film 40, thereby completing a low resistance metal line. The plating may be conducted using an electroless plating method or using electroplating, as a wet process.

In one embodiment, once the sequence of applying the SAM, forming the seed layer through activation using the metal catalyst, and plating the assistant metal film is conducted, a high-density seed layer is obtained, and the adhesion of a final metal layer may be completed, resulting in a high-quality metal line.

Examples of the metal that may be used in plating the final metal layer include Cu, Ni, Ag, Au, or metal alloys thereof, or a combination comprising at least one of the forgoing metals. The metal used may be appropriately selected depending on the end use of the metal line. Specifically, in order to obtain a highly conductive metal pattern, a copper metal compound solution or a silver metal compound solution may be used.

The electroless plating, or the electroplating, may be carried out according to methods typically known in the art. As an example, the method of electroless copper plating is described below. First, a substrate is immersed for a predetermined time, in a plating solution comprising: 1) a copper salt, 2) a complexing agent, which forms a ligand with the copper ion to thus inhibit a liquid reaction, 3) a reducing agent for reducing the copper ion, 4) a pH control agent for maintaining a pH appropriate for oxidization of the reducing agent, and optionally, 5) a pH buffering agent, and 6) a modifying agent.

Examples of the copper salt include copper chloride, copper nitrate, copper sulfate, or copper cyanide, or a combination comprising at least one of the foregoing copper salts. Specifically, copper sulfate is used.

Examples of the reducing agent include $NaBH_4$, $KBH_4$, $NaH_2PO_2$, hydrazine, formalin, or a polysaccharide, including glucose, or a combination comprising at least one of the foregoing reducing agents. Specifically, formalin, or a polysaccharide, including glucose, is used.

Examples of the complexing agent include an ammonia solution, acetic acid, guanine acid, tartaric acid, a chelating agent, for example, EDTA or a Rochelle salt, or an organic amine compound, or a combination comprising at least one of the foregoing complexing agents. Specifically, a chelating agent, for example EDTA, is used.

Examples of the pH control agent include an acid or a base compound, and examples of the pH buffering agent include various organic acids or weakly acidic inorganic compounds.

The modifying agent is used to improve the coating and planarization properties of the plating layer. Examples of modifying agents include typical surfactants and adsorptive substances capable of adsorbing components that inhibit the crystal growth.

In the case where an electroplating process is used for copper metal crystal growth, the electroplating is conducted in a manner such that the lower conductive line film is immersed in a plating composition comprising: 1) a copper salt, 2) a complexing agent, 3) a pH control agent, 4) a pH buffering agent, and 5) a modifying agent.

In one embodiment, after the metal layer is plated to thus obtain the low resistance metal line, annealing may be further conducted to remove water residue from the low resistance metal line, and to improve the electrical properties and the adhesion of the metal layer. The annealing may be carried out at about 40 to about 400° C. for about 15 to about 120 minutes in a nitrogen or argon gas atmosphere or, in a vacuum.

In another embodiment, a passivation layer may be formed on the metal layer using electroless plating methods, in order to protect the low resistance metal line. Such a passivation layer may comprise nickel or a nickel alloy.

In yet another embodiment, photolithography is used only in the formation of the mask pattern to thus form a pattern. A vacuum deposition process, such as sputtering, is not used in the entire process but rather a wet film-forming plating process is used instead. The wet film-forming process is less expensive than the vacuum deposition process, and because the number of etching processes is decreased, the total preparation cost is also decreased. In addition, because the wet film-forming technique is conducted in an aqueous solution phase, the film may be formed at a temperature of less than or equal to 100° C., thereby decreasing the amount of energy consumption, as compared to a dry film forming technique. In addition, the equipment used for the wet process has fewer restrictions than equipment used for the dry process, consequently allowing for the use of a large-sized substrate and the formation of a uniform film over the entire surface of the substrate.

In accordance with one embodiment, a patterned metal line structure is provided, which possesses superior electrical properties, excellent adhesion to the substrate, and which is formed using a simple preparation process. In another embodiment, the metal line structure on the substrate comprises the SAM layer, the seed layer comprising the metal catalyst, and the assistant metal film layer, wherein each layer is formed between the lower substrate and the upper metal layer.

Figure 4A:
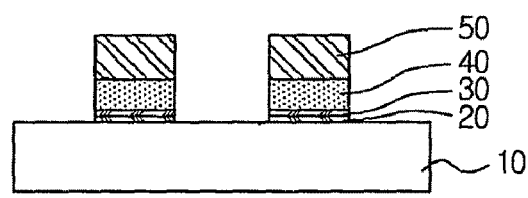
FIG. 4A is an exemplary schematic cross-sectional view illustrating a low resistance metal line structure.

FIG. 4A is an exemplary schematic cross-sectional view illustrating the low resistance metal line structure. The metal line structure comprises a SAM layer 20 disposed on a substrate 10, a seed layer 30 containing a metal catalyst disposed on the SAM 20, and an assistant metal film layer 40 and a metal layer 50 formed on the seed layer 30.

In the metal line structure of example embodiments, the SAM is not particularly limited, and is formed with a SAM forming compound, which may include an organosilane compound.

Figure 4B:
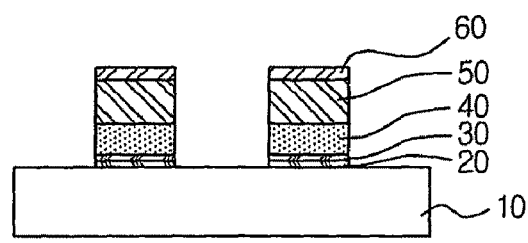
FIG. 4B is another exemplary schematic cross-sectional view illustrating a low resistance metal line structure.

In accordance with another embodiment, the metal line structure may further comprise a passivation layer. With reference to FIG. 4B, a passivation layer 60, comprising nickel or a nickel alloy, is formed on the surface of the metal layer 50 in order to protect the metal layer.

In accordance with yet another embodiment, the SAM adheres strongly to the substrate, thereby providing high adsorption strength and density to the metal layer, and enabling the formation of the high-density seed layer, which allows for the formation of a high-quality metal line structure. Thereby, resistivity is less than or equal to about 3.0 microohms per centimeter ($\mu\Omega\cdot cm$), resulting in superior electrical conductivity, improved gloss, and improved metal layer adhesion.

The metal line structure described herein may be applied to various display devices, including, for example, liquid crystal displays (LCDs), field emission displays (FEDs), electrophoretic displays (EPDs), plasma display panels (PDPs), electroluminescent displays (ELDs), and electrochromic devices (ECDs), flat panel type image sensors using an active matrix substrate, printed line substrates using a ceramic substrate, or the like, or a combination comprising at least one of the foregoing display devices. Specifically, in the case of an LCD, the LCD may be large in size even while the fabrication cost of the device is decreased.

A general LCD structure comprises: a gate line formed in a transverse direction, a data line formed in a longitudinal direction which is crosslinked with the gate line, and a TFT formed in the area where the gate line and the data line intersect. The pixel region, defined by the area where the gate and data lines intersect, comprises a pixel electrode connected to the TFT through a drain contact hole. The TFT comprises: a gate electrode branched from the gate line, a semiconductor layer covering the gate electrode, a source electrode branched from the data line and overlapping with the semiconductor layer by a predetermined distance, and a drain electrode, spaced apart from the source electrode, which connects the pixel electrode and the TFT.

Figure 5:
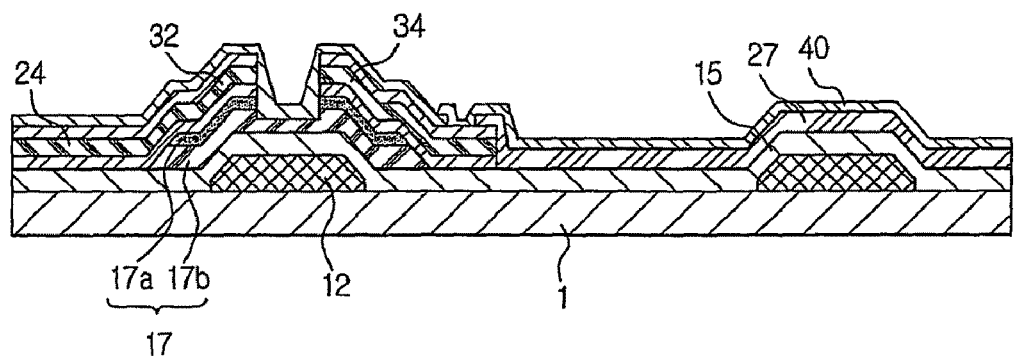
FIG. 5 is an exemplary schematic cross-sectional view illustrating an LCD.

FIG. 5 is an exemplary schematic cross-sectional view illustrating the LCD comprising the metal line structure described herein. As illustrated in FIG. 5, the LCD comprises a gate electrode 12 formed on a transparent substrate 1, a gate insulating film 15 formed on the gate electrode 12 and across the entire upper surface of the substrate, and a semiconductor layer 17 formed only on the section of gate insulating film 15 that is disposed on the gate electrode 12. Source electrodes 32 and drain electrodes 34, which are spaced apart from each other by a predetermined interval, are formed on the semiconductor layer 17. A channel is formed between the source and drain electrodes 32, 34. The semiconductor layer 17 comprises an active layer 17a formed of pure amorphous silicon (a-Si), and an ohmic contact layer 17b formed of impure amorphous silicon (n+a-Si) that is positioned on the surface of the active layer 17a. Further, a passivation layer 27 having a drain contact hole for exposing part of the drain electrode 34, is formed on the TFT, and a pixel electrode 40 that is connected to the drain electrode 34 through the drain contact hole, is formed in the pixel region on the passivation layer 27. The structure of the LCD described herein is not limited thereto, and may be variously changed or modified by those skilled in the art.

A better understanding of exemplary embodiments will be described in more detail with reference to the following examples. However, these examples are given for the purpose of illustration merely and are not to be construed as limiting the scope of the embodiments.

EXAMPLES

Example 1

On a dielectric glass substrate for a display, an AZ-1512 photoresist (Clariant), with a viscosity of 20 centipoise (cP), was subjected to spin coating at 1200 rotations per minute (rpm) for about 30 sec at room temperature. The substrate, overlaid with a photomask, was exposed to broadband UV light (available from Oriel) of 9 millijoules per centimeter (mJ/cm) for about 7 sec, and was then developed, thus forming a pattern.

Subsequently, the substrate was surface treated by immersion in a hexane solution containing 0.5 wt % of aminopropyl triethoxysilane at room temperature for about 40 min, and was then annealed at about 100° C. for about 30 sec in order to evaporate the solvent. Thereafter, into a 2 liter (L) beaker, 1 L of deionized water, 2 milliliters (ml) of concentrated hydrochloric acid, and then 0.03 grams (g) of $PdCl_2$ were added, and dissolved with vigorous stirring, thus preparing a palladium activating solution (Table 1, composition (a)). The activating solution was applied on the substrate through spin coating (30 sec, 2000 rpm), after which the substrate was immersed in a Ni electroless plating bath for 30 sec.

Figure 6:
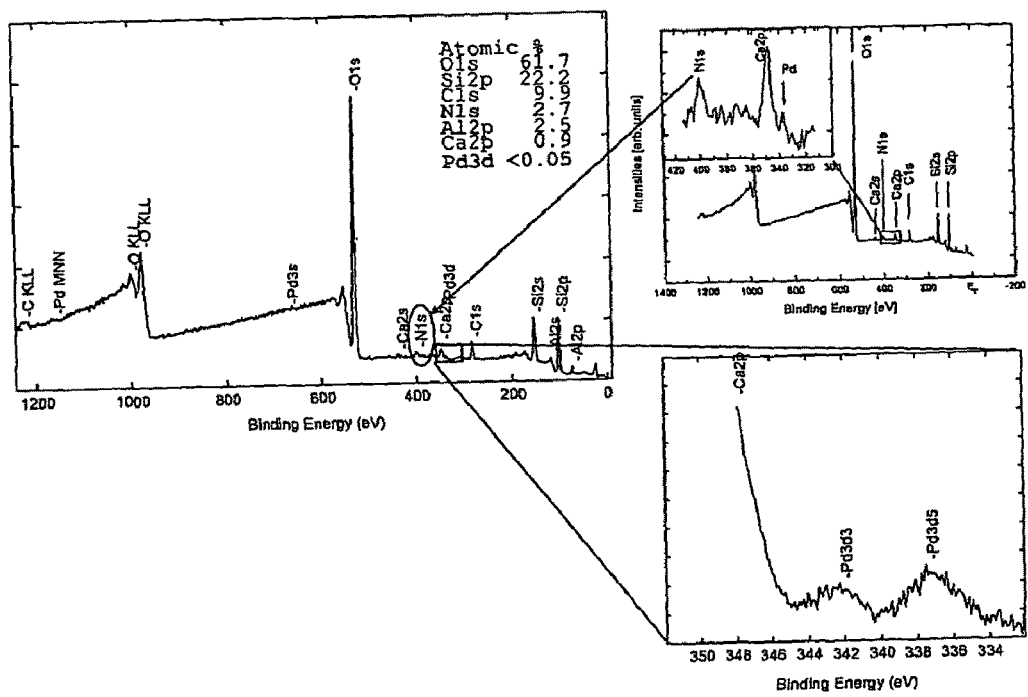
FIG. 6 is a graph illustrating the results of X-ray Photoelectron Spectroscopy (XPS) for the metal line structure prepared as described in Example 1.

The X-ray Photoelectron Spectroscopy (XPS) of the substrate subjected to SAM formation and activation, was measured. The results are shown in FIG. 6. The curves for the nitrogen component of both aminopropyl triethoxysilane and of palladium, used as a metal catalyst, can be more readily observed in the enlarged portions of FIG. 6.

The substrate plated with the nickel film was treated with acetone as a stripper of the photoresist, thereby lifting off the photoresist. The patterned substrate was immersed in an electroless Cu plating solution containing composition (b) of Table 1 at about 65° C. for about 5 min, thus obtaining a copper line about 350 nm thick.

TABLE 1

| (a) Pd Activating Solution | | (b) Cu Plating Solution | |
|---|---|---|---|
| Deionized Water | 1 L | Copper Sulfate | 3.5 g |
| Conc. Hydrochloric Acid | 2 ml | Tartaric acid | 8.5 g |
| PdCl$_2$ | 0.03 g | Formalin (37%) | 22 ml |
| | | Thiourea | 1 g |
| | | Ammonia | 40 g |

Experimental Example 1

Measurement of Resistivity

Figure 7:
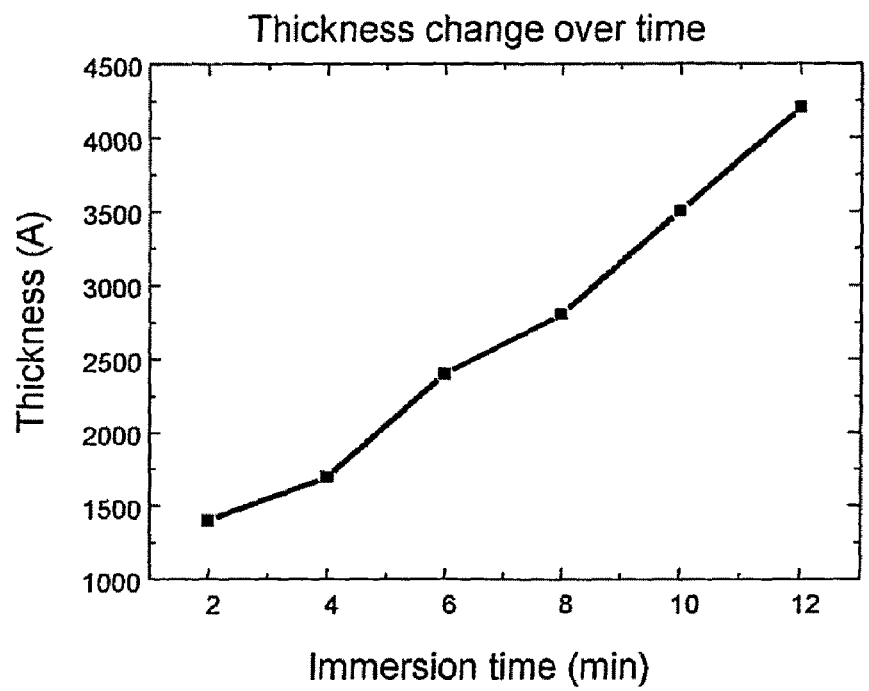
FIG. 7 is a graph illustrating the change in the thickness of the metal layer prepared in Example 1 as a function of the immersion time.

The resistivity of the metal line structure obtained in Example 1 was measured using a 4-point probe. As the result, the resistivity was determined to be about 2.7 μΩ·cm, which is considered to be superior. Further, the change in thickness of the metal layer as a function of the immersion time was also measured. The results are shown in FIG. 7. In addition, the change in resistivity as a function of the thickness of the metal layer was measured. The results are shown in FIG. 8.

Figure 8:
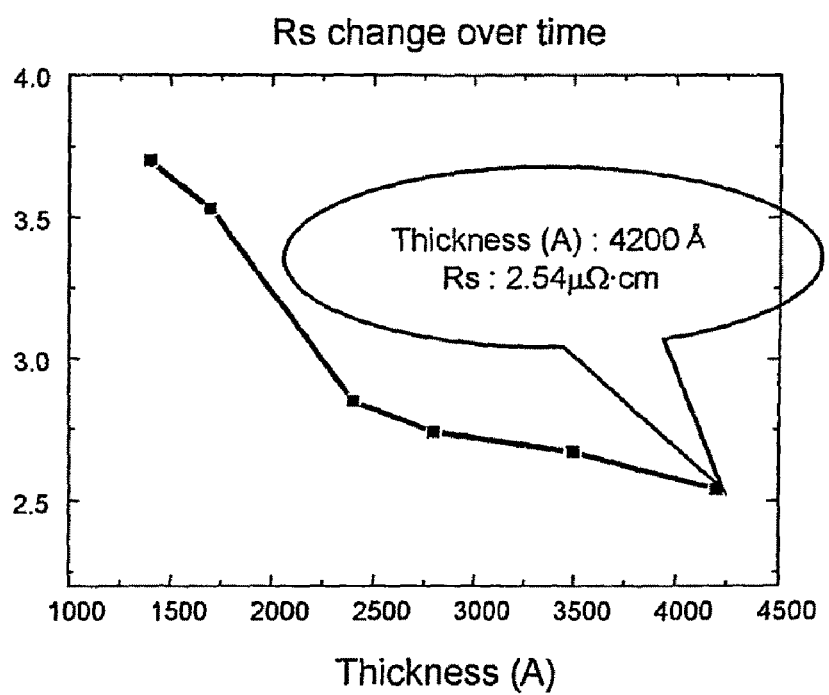
FIG. 8 is a graph illustrating the change in the resistivity of the metal line prepared in Example 1 as a function of the thickness of the metal layer.

As illustrated by the results shown in both FIGS. 7 and 8, a metal line with superior resistivity was obtained by means of a simple and inexpensive process.

As described herein, a method is provided for preparing a low resistance metal line, a patterned metal line structure, and a display device using the same. According to the method, a low resistance metal line may be efficiently obtained within a short period of time using a wet film forming process, in place of the conventional sputtering process that requires high-temperature and high-vacuum conditions. Consequently, the monetary investment that is needed to establish and operate manufacturing facilities is significantly reduced, as are the direct costs for preparation of the material itself. Further, the method may also be applied to a substrate made from a flexible material, and the line may be continuously produced through a roll-to-roll process, thereby increasing productivity.

The exemplary metal line structure has increased metal layer adhesion and excellent resistivity, and therefore, a display device using the metal line structure may have improved product reliability and price competitiveness.

Although example embodiments have been disclosed for illustrative purposes, those skilled in the art will appreciate that various modifications, additions and substitutions are possible, without departing from the scope and spirit of the invention as disclosed in the accompanying claims.

What is claimed is:

1. A method of preparing a low resistance metal line comprising:
   forming a mask pattern for a metal line on a substrate;
   applying a self-assembled monolayer on the substrate;
   forming a seed layer on the substrate comprising the self-assembled monolayer;
   plating an assistant metal film on the seed layer;
   removing the mask pattern and layers thereon by means of lift-off; and
   plating a metal layer on the patterned assistant metal film.

2. The method of claim 1, wherein the self-assembled monolayer comprises an organosilane compound.

3. The method of claim 2, wherein the self-assembled monolayer comprises a material represented by Formula 1 below:

$$\text{Si(OR)}_{3-n}(R)_n X \quad \text{[Formula 1]}$$

wherein R is a C$_{1-12}$ alkyl group, an alkylene group, or a phenyl group;
X is AB, in which A is a C$_{1-12}$ alkyl group, an alkylene group, or a phenyl group, and B is an amino group, a cyano group, a mercapto group, a pyridine group, or a diphenylphosphine group; and
n is an integer from 0 to 3.

4. The method of claim 3, wherein the self-assembled monolayer comprises a material selected from a material group represented by Formula 2 below:

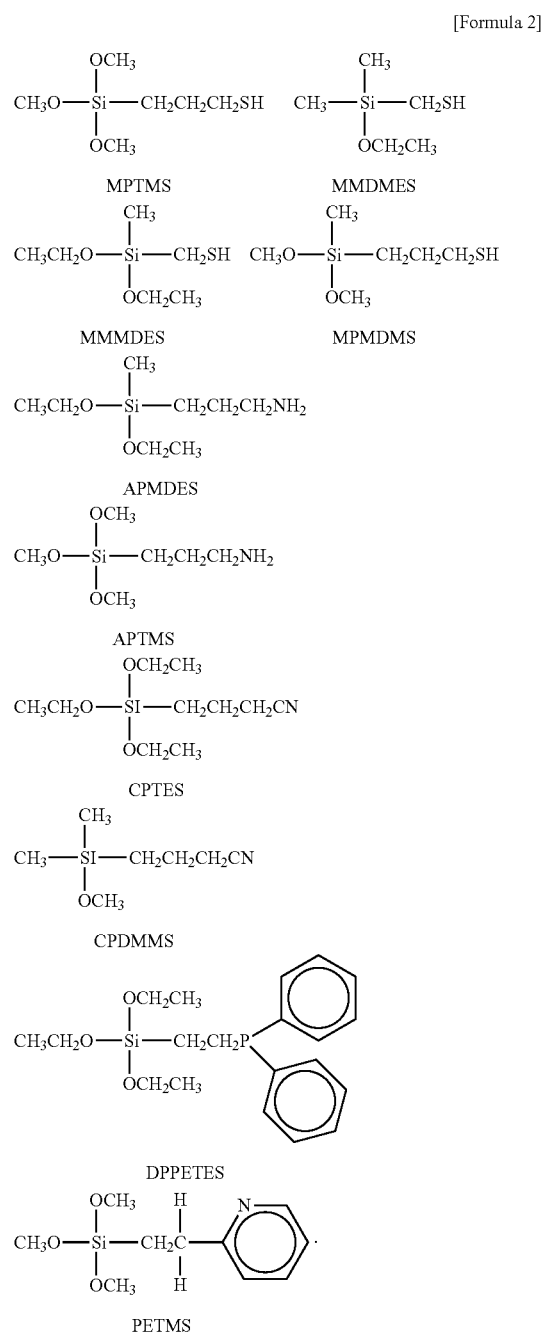

[Formula 2]

5. The method of claim 1, wherein forming the seed layer is conducted using immersing method, spin coating, vapor deposition, Langmuir Blodgett method, or combinations thereof.

6. The method of claim 1, wherein the forming the seed layer is conducted through activation using a metal selected from gold, silver, copper, nickel, tin, iron, platinum, palladium, palladium alloy, palladium chloride, or a combination comprising at least one of the foregoing metals for activation.

7. The method of claim 1, wherein plating the assistant metal film is conducted using a metal selected from nickel, tin, cobalt, or zinc, or a combination comprising at least one of the foregoing metals.

8. The method of claim 1, wherein plating the metal layer is conducted using electroless plating or electroplating.

9. The method of claim 1, wherein plating the metal layer is conducted using a metal selected from Ni, Cu, Ag, Au, or alloys thereof, or a combination comprising at least one of the foregoing metals.

10. The method of claim 1, wherein plating the metal layer is conducted by immersing the substrate in an electroless copper plating solution comprising a copper salt, a complexing agent, a reducing agent, and a pH control agent.

11. The method of claim 1 further comprising: forming a passivation layer on the metal layer.

12. The method of claim 11, wherein forming the passivation layer is conducted using a material selected from nickel, molybdenum, a nickel alloy, and a molybdenum alloy.

13. The method of claim 1 further comprising: annealing the low resistance metal line obtained after forming the metal layer.

14. The method of claim 13, wherein the annealing is conducted at about 40 to about 400° C. for about 15 to about 120 minutes in a nitrogen or argon gas atmosphere, or in a vacuum.

* * * * *